United States Patent [19]
Chen et al.

[11] Patent Number: 5,625,215
[45] Date of Patent: Apr. 29, 1997

[54] SRAM CELL WITH BALANCED LOAD RESISTORS

[75] Inventors: Min-Liang Chen, Hsin-chu, Taiwan; Werner Juengling, Graz, Austria

[73] Assignee: Lucent Technologies Inc., Murray Hill, N.J.

[21] Appl. No.: 413,014

[22] Filed: Mar. 28, 1995

Related U.S. Application Data

[63] Continuation of Ser. No. 200,843, Feb. 22, 1994, abandoned, which is a continuation of Ser. No. 980,859, Nov. 24, 1992, abandoned.

[51] Int. Cl.$^6$ ............................................. H01L 27/11
[52] U.S. Cl. .................. 257/379; 257/369; 257/536; 257/904; 257/919; 365/148; 365/188
[58] Field of Search ................................. 257/904, 369, 257/379, 758, 919, 536; 365/148, 188

[56] References Cited

U.S. PATENT DOCUMENTS

| | | | |
|---|---|---|---|
| 3,539,839 | 11/1970 | Igarashi | 257/904 |
| 4,641,173 | 2/1987 | Malhi et al. | 357/51 |
| 4,841,481 | 6/1989 | Ikeda et al. | 257/379 |
| 4,853,894 | 8/1989 | Yamanska et al. | 365/154 |
| 5,081,515 | 1/1992 | Murata et al. | 257/758 |
| 5,172,202 | 12/1992 | Kazuo | 257/758 |

FOREIGN PATENT DOCUMENTS

| | | | |
|---|---|---|---|
| A-0099983 | 2/1984 | European Pat. Off. | H01L 27/10 |
| A-0365690 | 5/1990 | European Pat. Off. | H01L 27/04 |
| A-2916426 | 10/1979 | Germany | H01L 27/12 |
| 57-210663 | 12/1982 | Japan | 257/904 |
| 62-169472 | 7/1987 | Japan | 257/904 |
| 62-210666 | 9/1987 | Japan | 257/904 |
| 62-112362 | 10/1987 | Japan | H01L 27/10 |
| 63-45853 | 2/1988 | Japan | 257/904 |
| WO/8911162 | 11/1989 | WIPO | 257/904 |

OTHER PUBLICATIONS

Y. Kohno et al, "A 14-ns 1-Mbit CMOS SRAM with Variable Bit Organization", IEEE Journal of Solid-State Circuits, vol. 23, No. 5, Oct. 1988, pp. 1060–1066.
European Search REport EP 93 30 9228.
International Search Report PCT/JP89/00433.

*Primary Examiner*—Jerome Jackson, Jr.
*Assistant Examiner*—John Guay
*Attorney, Agent, or Firm*—Richard D. Laumann; David M. Sigmond

[57] ABSTRACT

SRAM cells are manufactured with balanced, high-resistance load resistances by having substantially all of dielectric layer directly over the polysilicon load resistor covered by a metal layer. The metal layer protects the polysilicon during subsequent processing which can adversely alter its characteristics.

4 Claims, 1 Drawing Sheet ns,215

SRAM CELL WITH BALANCED LOAD RESISTORS

This application is a continuation of application Ser. No. 08/200,843, filed on Feb. 22, 1994, now abandoned which is a Continuation Application under 37 CFR 1.62 of prior application Ser. No. 07/980,859 filed on Nov. 24, 1992 now abandoned.

TECHNICAL FIELD

This invention relates to SRAM memories with cells typically having four transistors and two load resistors.

BACKGROUND OF THE INVENTION

Although the most commonly used semiconductor memory at the present time is the dynamic random access memory (DRAM), static random access memories (SRAMs) find many applications because of, e.g., their relatively high speed as compared to DRAMs. A typical SRAM cell has four transistors and two load resistors. The resistors may be formed by a field-effect transistor in its stare or by high-resistance polysilicon. To reduce the substrate surface area used by the cell, the load resistors are typically above and separated from the four transistors by an intervening dielectric layer. A dielectric layer is deposited on the load resistors and further processing forms the contacts to the resistors, bit lines, etc.

The load resistors should satisfy several criteria, including high resistance and comparable values; that is, the resistors in a cell should be balanced so as to have approximately equal resistances. However, we have found that in SRAM cells with polysilicon resistors the values of the resistances can vary enormously; for example, from 1000 Teraohm/square to 1 Mohm/square. Not only can the resistors be unbalanced, but they may have values that are unacceptably low.

SUMMARY OF THE INVENTION

A semiconductor integrated circuit uses an SRAM cell having a plurality of transistors and a plurality of load resistors. In an exemplary embodiment, there are four transistors and two load resistors. The load resistors comprise silicon and are formed on a dielectric layer which is between the four transistors, formed on a substrate, and the load resistors. Each load resistor has a longitudinal axis and is also covered by a first dielectric layer. The integrated circuit further has a metal layer on the first dielectric layer which covers substantially all of the surface area of the two load resistors. In one embodiment, the metal layer comprises a plurality of bit lines. The bit lines are parallel to the longitudinal axes of the load resistors.

For reasons of clarity, the elements depicted are not drawn to scale.

DETAILED DESCRIPTION

The invention will be described with respect to an exemplary embodiment.

Four transistors, T1, T2, T3, and T4, and two load resistors, R1 and R2 form an SRAM cell. There are two access transistors and two pull-down transistors. The electric circuit of the cell is well known to those skilled in the an and need not be described in detail. Fabrication of the circuit, except for the formation of the resistors and subsequent processing, according to this invention, is also well known to those skilled in the art and need not be described.

For best operation, the resistances of the load resistors should be large and R1 and R2 should have approximately equal values. We have found that, in many cases, the resistances vary in magnitude, ranging from 1000 Gohms/square to 1 Gohm/square, and R1 and R2 may have significantly different values. These variations are explained by the following hypothesis. After the polysilicon has been deposited and patterned to form the load resistors, a dielectric layer is deposited. Further processing is then performed. This processing may be selective etching of the dielectric, depositing and patterning of a metal overlayer together with some etching of the dielectric layer, etc. After the poly load formation, the traditional dielectric 1 (BPSG/TEOS) contact opening and metal 1 patterning are then performed. For high-speed SRAM applications, a two-level metal is preferred for metal routing. The inter-level dielectric involves a plasma enhanced oxide deposition and etch back technique. Charge trapping of mobile ions often occurs during these processing steps. This charge will induce the conduction path on the poly load and, hence, reduce the poly load resistance and cause a higher standby current or unbalance the memory cell. With the metal 1 bit line fully coveting the poly load as a field shield, then whatever charge is on the dielectric 1 will not influence the poly load resistivity which provides the freedom for intermetal dielectric processing.

Figure 1:
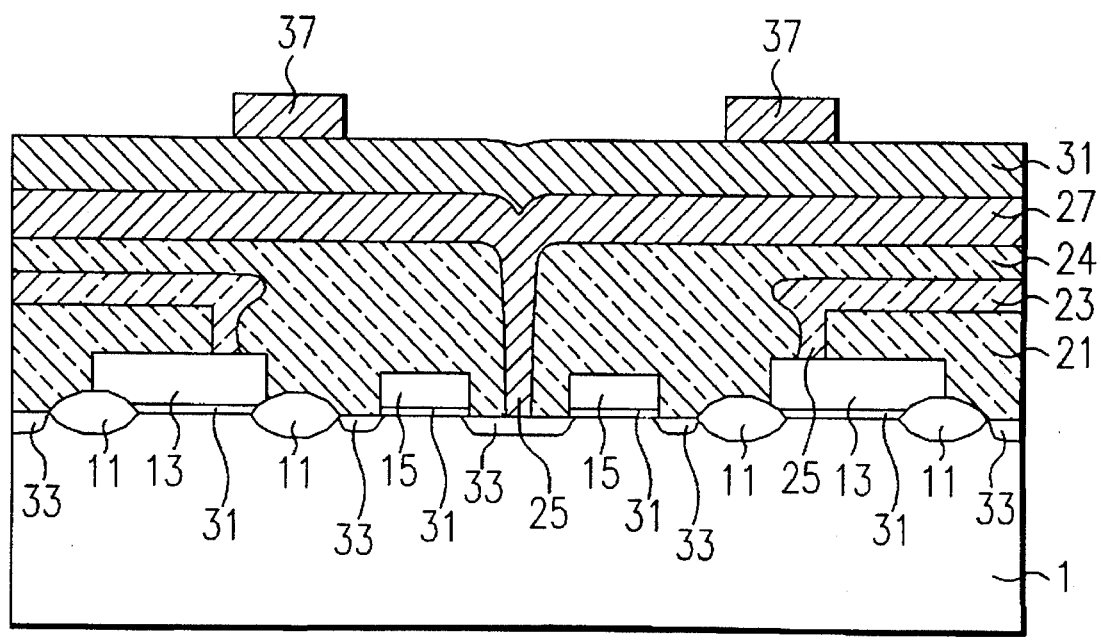
FIG. 1 is a sectional view of a potion of an SRAM cell which shows the load resistors and the surrounding elements.

A sectional view of a portion of the integrated circuit is depicted in FIG. 1. Shown are substrate 1, dielectric layer 21, resistors 23, dielectric layer 24, contact windows 25, and metal layer 27. Metal layer 27 forms metal 1. Also depicted are pull-down transistors 13 and access transistors 15. The transistors are on the substrate 1 source/drain regions 33 are shown as are gate oxides 31. Field oxide regions 11 separate the transistors from each other. Layer 21 is between the resistors 23 and substrate 1. Source/drain regions 33 are shown as are gate oxides 31. There is also an inter-level dielectric 31 and metal 2 runners 37 or conductors. The inter-level dielectric is a second dielectric. As can be seen, a portion of metal layer 27 forms an overlayer on dielectric layer 24 over the load resistor 23 between contact windows 25. This portion of metal layer 27 protects the load resistor from damage during subsequent processing; that is, it covers substantially all of the load resistor and acts as a field shield. The structure depicted will be readily fabricated by those skilled in the art.

Figure 2:
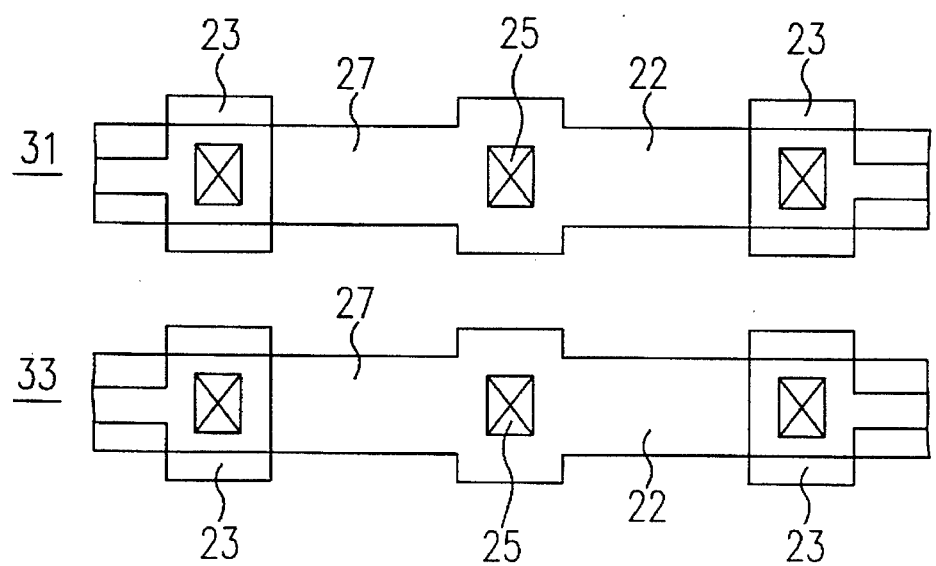
FIG. 2 is a top view of an SRAM cell showing the load resistors and their metal overlays.

A top view of a portion of an integrated circuit according to this invention is depicted in FIG. 2. For reasons of clarity, the four transistors are not depicted. In addition to the elements depicted in FIG. 1, bit lines 31 and 33 are shown in FIG. 2. The bit lines are formed by the metal layer 27. That is, metal layer 27 has been patterned to form the bit lines 31 and 33. The bit lines completely overlay the surface area of the two load resistors, and the resistors have high and comparable resistances. The longitudinal axes of the resistors are parallel to the longitudinal axes of the bit lines. The bit-line metal serves as a field screen plate preventing the charges in intermetal oxide (created during intermetal dielectric process) inducing the image charges on the poly load. Their resistances remain high. If the polysilicon is not protected from processing-induced charges, the exposed portion acquires a relatively low resistance of the polysilicon. The resistor becomes electrically equivalent to two parallel connected resistors having high and low resistances, depending upon whether the polysilicon is protected or unprotected, respectively. The resistor thus has a relatively low resistance. It is thus desirable that the metal overlayer, whether it is formed from bit lines or other metal elements, cover all of surface area of both the polysilicon load resistors.

Variations to the embodiments described will be readily thought of by those skilled in the art.

We claim:

1. A semiconductor integrated circuit having an SRAM cell having four transistors comprising:

a substrate;

a plurality of transistors, said transistors being on said substrate;

two of said transistors being access transistors and two of said transistors being pull-down transistors;

a dielectric layer;

two high resistance load resistors comprising silicon, said dielectric layer being between said load resistors and said substrate;

a first dielectric layer over said load resistors;

a metal layer on said first dielectric layer, said metal layer both providing electrical communication to at least one of said transistors and covering substantially all surface area of said load resistors thereby providing a field shield for said covered surface area of said load resistors;

a second dielectric layer on said metal layer, said second dielectric layer containing trapped charged ions capable of inducing conduction paths wherein said metal layer prevents said ions from inducing conduction paths in said covered surface area of said load resistors; and conductors on said second dielectric layer, wherein said load resistors have longitudinal axes and said metal layer comprises a plurality of bit lines, said bit lines being parallel to said longitudinal axes of said two load resistors.

2. An integrated circuit as recited in claim 1 wherein said load resistors have approximately equal resistances.

3. An integrated circuit as recited in claim 1 wherein said metal layer covers all surface area of said load resistors thereby preventing said ions from inducing any conductive paths in said load resistors.

4. An integrated circuit as recited in claim 1 wherein said metal layer covers a first portion of said surface area and exposes a second portion of said surface area such that said ions induce conductive paths in said second portion and each of said load resistors becomes electrically equivalent to first and second parallel connected resistors, said first resistors corresponding to said first portion and having high resistance, said second resistors corresponding to said second portion and having low resistance.

* * * * *